(12) United States Patent
Abramovich

(10) Patent No.: US 6,362,498 B2
(45) Date of Patent: Mar. 26, 2002

(54) COLOR IMAGE SENSOR WITH EMBEDDED MICROLENS ARRAY

(75) Inventor: Irit Abramovich, Alon Hagalil (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/803,346

(22) Filed: Mar. 9, 2001

Related U.S. Application Data

(62) Division of application No. 09/470,558, filed on Dec. 23, 1999, now Pat. No. 6,221,687.

(51) Int. Cl.[7] .............................................. H01L 27/148
(52) U.S. Cl. ........................ 257/233; 257/225; 257/215
(58) Field of Search .......................... 257/233, 231, 257/225, 213; 438/70, 60, 65

(56) References Cited

U.S. PATENT DOCUMENTS

| 5,239,412 A | 8/1993 | Naka et al. |
| 5,796,154 A | 8/1998 | Sano et al. |
| 5,877,040 A | 3/1999 | Park et al. |
| 6,030,852 A | 2/2000 | Sano et al. |
| 6,043,001 A | 3/2000 | Hirsh et al. |
| 6,171,883 B1 * | 1/2001 | Fan et al. ..................... 438/65 |

FOREIGN PATENT DOCUMENTS

| JP | 362023161 A | 1/1987 |
| JP | 404226073 A | 8/1992 |

* cited by examiner

Primary Examiner—Richard Elms
Assistant Examiner—Bradley Smith
(74) Attorney, Agent, or Firm—Bever, Hoffman & Harms, LLP; Patrick T. Bever

(57) ABSTRACT

A color CMOS image sensor including a matrix of pixels (e.g., CMOS APS cells) that are fabricated on a semiconductor substrate. A silicon-nitride layer is deposited on the upper surface of the pixels, and is etched using a reactive ion etching (RIE) process to form microlenses. A protective layer including a lower color transparent layer formed from a polymeric material, a color filter layer and an upper color transparent layer are then formed over the microlenses. Standard packaging techniques are then used to secure the upper color transparent layer to a glass substrate.

11 Claims, 8 Drawing Sheets

COLOR IMAGE SENSOR WITH EMBEDDED MICROLENS ARRAY

This application is a divisional of application Ser. No. 09/470,558 now U.S. Pat. No. 6,221,687 filed Dec. 23, 1999.

FIELD OF THE INVENTION

The present invention relates to solid state image sensors. More specifically, the present invention relates to a method for fabricating color image sensors and to a color image sensor fabricated by the method.

RELATED ART

Solid state color image sensors are used, for example, in video cameras, and are presently realized in a number of forms including charge-coupled devices (CCDs) and CMOS image sensors. These image sensors are based on a two dimensional array of pixels. Each pixel includes color filter located over a sensing element. An array of microlenses located over the color filter focuses light from an optical image through the color filter into the image sensing elements. Each image sensing element is capable of converting a portion of the optical image passed by the color filter into an electronic signal. The electronic signals from all of the image sensing elements are then used to regenerate the optical image on, for example, a video monitor.

FIG. 1(A) is a cross-sectional view showing a portion of a conventional color image sensor 10. Color image sensor 10 if formed on an n-type semiconductor substrate 11 having a p-well layer 15. An array of photodiodes 20 and charge transfer regions 25 are formed in p-well layer 15, and are covered by a silicon oxide or nitride film 30. A polysilicon electrode 35 is located over charge transfer region 25 such that it is surrounded by film 30. A photo-shielding metal layer 40 is formed over electrode 35, and a surface protective coating 45 and a planarization layer 50 are formed over metal layer 40. A color filter layer 60 is formed on planarization layer 50, and an intermediate transparent film 70 is formed over color filter layer 60. A microlens 80 for focusing light beams 85 is formed from silicon dioxide (SiO$_2$) or a resin material on intermediate transparent film 70. An air gap 90 is provided over microlens 80, and a glass packaging substrate 95 is located over air gap 90.

In operation, light beams 85 are focused by microlens 80 through color filter layer 60 such that they converge along the focal axis F of microlens 80 to strike photodiode 20, wherein photoenergy from light beams 85 frees electrons in photodiode 20. When a select voltage is applied to polysilicon electrode 35, these freed electrons generate a current in charge transfer region 25. A sensor circuit (not shown) of color image sensor 10 then determines the amount of light received by photodiode 20 by measuring the amount of current generated in charge transfer region 25.

Conventional solid-state imaging device 10 is designed for light beams 85 whose incident angle is perpendicular to substrate 11, as shown in FIG. 1(A), before being focused by microlens 80 onto photodiode 20. However, during actual operation of color image sensor 10, light beams can strike microlens 80 at oblique incident angles. A consequence of these oblique light beams is shown in FIG. 1(B). In particular, light beams 87 enter microlens 80 at an oblique angle, which directs light beams 87 away from focal axis F such that they converge at the edge of photodiode 20. Because the photoenergy of light beams 87 is not fully transferred to photodiode 20, color image sensor 10 is unable to generate an accurate image.

Another problem associated with conventional solid-state imaging device 10 is that non-standard packaging methods are required due to the formation of microlenses 80 over color filter layer 60 and intermediate transfer layer 70. Standard packaging methods typically include securing a glass substrate to an IC device using a layer of cement (e.g., epoxy). This cement typically has an index of refraction that is the same as silicon-dioxide and other resins typically used to form microlens 80 and other layers of conventional solid-state imaging device 10. Therefore, to facilitate proper focusing of the light beams, air gap 90 must be provided between glass packaging substrate 95 and microlens 80. Because air gap 90 is used in place of cement, the packaging method used to produce conventional solid-state imaging device 10 is non-standard.

It would be possible to avoid the oblique light beam problem (discussed above) by moving microlens 80 closer to photodiode 20, thereby shortening the distance traveled by the light beams between microlens 80 and photodiode 20. This shortened distance would reduce the displacement of focused oblique light beams 87 (see FIG. 1(B)) relative to the center of photodiode 20, thereby transferring more photoenergy from these oblique light beams to photodiode 20.

One possible method of moving microlens 80 closer to photodiode 20 would be to reduce the thickness of the various layers located below microlens 80. A problem with this method is that the thicknesses of these underlying layers are not easily reduced. First, photo-shielding layer 40 is typically formed during the formation of aluminum wiring utilized to transmit signals to and from each pixel of conventional solid-state imaging device 10. Therefore, the thickness of photo-shielding layer 40 is limited by the wiring specifications. Repositioning microlens 80 closer to photodiode 20 is further restricted by planarization layer 50, which is required to provide a flat surface for forming color filter layer 60 and microlens 80. Therefore, it is not possible to significantly reduce the distance between a surface-mounted microlens 80 and photodiode 20 in conventional solid-state imaging device 10 by reducing the thickness of the layers underlying microlens 80.

Another possible method of moving microlens 80 closer to photodiode 20 would be to form microlens 80 under color filter layer 60 (i.e., between photodiode 20 and color filter layer 60). This arrangement would also address the non-standard packaging problem because, with color filter layer 70-located above microlens 80, it would be possible to use cement to secure glass packaging substrate 95 according to standard packaging methods. However, forming microlens 80 under color filter layer 60 is not practical because, as discussed above, the index of refraction of conventional microlens materials (i.e., resin) is the same as that of other materials typically used to produce conventional solid-state imaging device 10. Therefore, because air gap 90 must be provided over conventional microlens 80, it would be very difficult to produce conventional solid-state imaging device 10 with microlens 80 located under color filter layer 60 using conventional microlens materials.

What is needed is a method for fabricating a color image sensor that minimizes the distance between the microlens and photodiode, and minimizes the fabrication and production costs of the color image sensor.

SUMMARY

The present invention is directed to a method for producing a color CMOS image sensor in which the microlens structure is embedded (i.e., located between the photodiode array and the color filter layer), thereby avoiding the oblique light beam problem, discussed above, because each microlens is located closer to its associated photodiode than in conventional image sensor structures. In addition, because the color filter layer is located above the microlenses and sandwiched between two color transparent layers, conventional image sensor packaging techniques (i.e., applying cement to the upper color transparent layer, then applying a glass substrate) may be utilized to produce color CMOS image sensors.

In accordance with a first embodiment of the present invention, an image sensor is produced by depositing a dielectric (e.g., silicon-nitride) layer over an image sensing element (e.g., a photodiode), etching the dielectric layer to form a microlens, and then depositing a protective layer on the microlens, wherein the protective layer has an index of refraction that is different from that of the dielectric. When silicon-nitride is utilized as the dielectric, conventional protective layer materials may be formed on the microlens because the refractive index of silicon-nitride is different from silicon-dioxide and other materials utilized as conventional protective layer materials. Therefore, the silicon-nitride microlenses of the present invention may be embedded under conventional protective materials without eliminating the optical performance of the microlenses. In alternative embodiments, other dielectrics may be used to form the microlens, provided the protective materials formed on the microlens have an index of refraction that is different from that of the dielectric. Because the microlens surface is located below a protective layer, conventional packaging techniques may be used that attach the protective layer to a substrate using cement, thereby reducing manufacturing costs and complexity.

In accordance with another embodiment of the present invention, a color image sensor is produced by depositing a silicon-nitride layer over an image sensing element (e.g., a photodiode), etching the silicon-nitride layer to form a microlens, depositing a color transparent layer on the microlens, and then forming a color filter on the color transparent layer. The silicon-nitride microlens has an index of refraction that is different from the color transparent layer, thereby forming an effective microlens structure that is embedded below the color filter. By forming the microlens below the color filter, the microlens is positioned closer to the image sensing element, thereby minimizing the oblique light beam problems, described above. In addition, by forming a second color transparent layer over the color filter, conventional packaging techniques may be used that attach the second color transparent layer to a substrate using cement, thereby reducing manufacturing costs and complexity.

The novel aspects of the present invention will be more fully understood in view of the following description and drawings.

DETAILED DESCRIPTION

The present invention is described below with reference to color CMOS active-pixel sensors (APSs), and in particular to color CMOS APSs utilizing photodiode light sensitive regions. The fabrication and operation of CMOS active-pixel sensors (APSs) are described in co-owned and co-pending U.S. application Ser. No. 09/315,893, entitled "Method And Structure For Minimizing White Spots In CMOS Image Sensors", invented by Yossi Netzer, which is incorporated herein by reference. However, the methods and structures described below may also be used to produce passive CMOS image sensors and CMOS APSs utilizing photogate light sensitive regions. In addition, the methods and structures may be used to produce CMOS APSs having any number of transistors (e.g., one, four or five). Moreover, the present inventors believe the methods and structures of the present invention may also be used to produce image sensors including MOS pixel arrays. As used herein, the general phrase "image sensor" is intended to cover all of these sensor array types.

Figure 2:
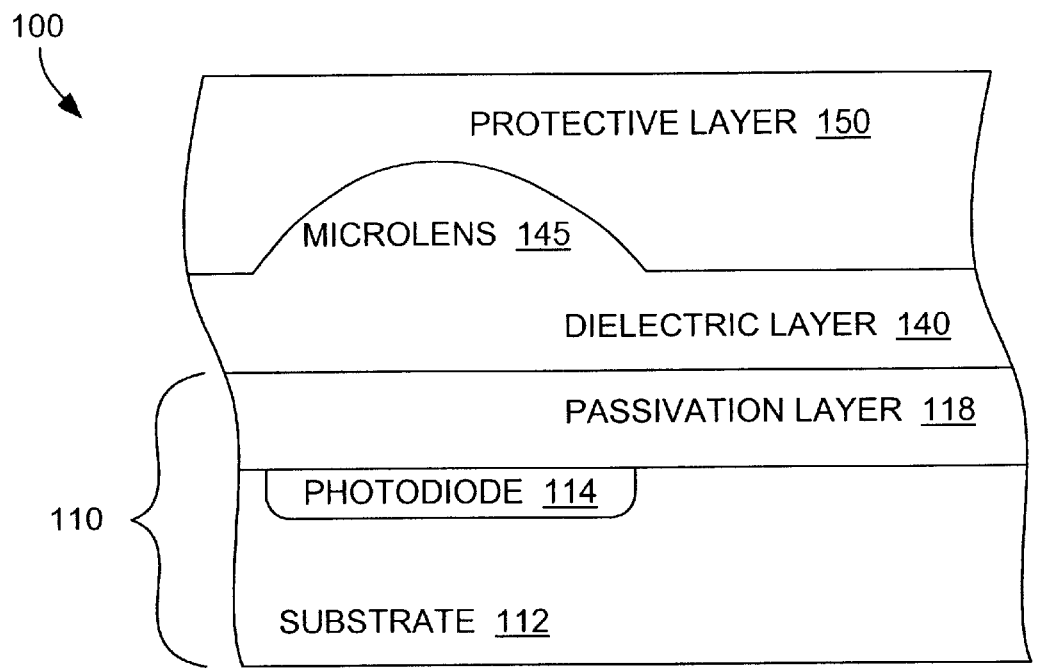
FIG. 2 is a schematic diagram of a solid-state imaging device according to a first embodiment of the present invention.

FIG. 2 is a cross-sectional view showing a portion of an image sensor 100 in accordance with an embodiment of the present invention. Image sensor 100 includes an image sensing element 110, a dielectric layer 140 formed over image sensing element 110 that is etched to include a microlens 145, and a protective layer 150 formed on microlens 145. Image sensing element 110 includes a photodiode region 114 that is diffused into a silicon substrate 112, and a passivation layer 118 formed on substrate 112. In one embodiment, dielectric layer 140 is formed on passivation layer 118, and has an index of refraction that is different from that of protective layer 150, thereby allowing microlens 145 to focus light beams passing through protective layer 150 onto photodiode region 114. In another embodiment, one or more intermediate layers (e.g., oxi-nitride, not shown) are formed between passivation layer 118 and dielectric layer 140.

Figure 3:
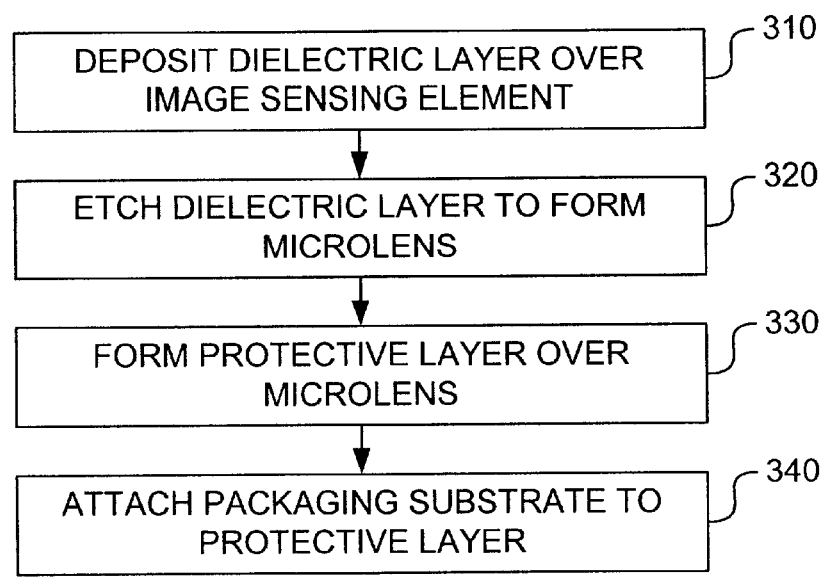
FIG. 3 is a flow diagram showing the basic steps for fabricating the solid-state imaging device shown in FIG. 2.

FIG. 3 is a flow diagram showing the basic steps associated with the formation of the image sensor 100 in accordance with the present invention. The process shown in FIG. 3 is performed after image sensing element 110 (FIG. 2) is fabricated using known techniques. At the end of this initial fabrication process, image sensing element 110 includes passivation layer 118 formed over photodiode region 114.

Referring to FIG. 3, the process begins with the deposition of dielectric layer 140 over passivation layer 118 (Step 310). The term "over" is intended to cover both the deposition of dielectric material directly on passivation layer 118, and the deposition of dielectric material on an intermediate layer(s) formed on passivation layer 118. In a presently preferred embodiment, dielectric material is silicon-nitride, which has an index of refraction that is higher than silicon-dioxide and other materials typically utilized in CMOS fabrication processes to form protective layer 150.

Next, dielectric layer 140 is etched to form microlenses 145 (Step 320). In one embodiment, this step is performed using a reactive-ion etching process according to known techniques. As indicated in FIG. 2, the etching process is controlled such that a portion of dielectric layer 140 remains over passivation layer 118.

Finally, protective layer 150 is formed over microlens 145 and other residual portions of dielectric layer 140 (Step 330). In black-and-white image sensors, protective layer 150 may be polyimide, resin, or may be packaging adhesive (e.g., epoxy cement) that is applied directly to the upper surface of microlens 145. As discussed in additional detail below, in color image sensor applications protective layer 150 may include one or more color transparent layers and color filter layers. In either of these applications, at least the portion of protective layer 150 that contacts microlens 145 is formed using a material having a index of refraction that is different from (i.e., lower than) that of dielectric layer 140. By forming protective layer in this manner, microlens 145 is able to effectively focus light beams onto photodiode region 114. Further, because microlens 145 is formed either directly on or immediately over passivation layer 118, the distance between microlens 145 and photodiode 114 is minimized, thereby minimizing the problems caused by oblique light beams (discussed above).

While Steps 310, 320 and 330 include the basic process steps for forming an image sensor in accordance with the present invention, another benefit of image sensor 100 is that conventional packaging techniques may be utilized. In particular, a packaging substrate may be attached to protective layer 150 using a packaging adhesive, such as epoxy cement (Step 340). Alternatively, when protective layer 150 is formed from packaging adhesive, the packaging substrate is attached directly to protective layer 150. Unlike prior art image sensors that require air gaps between the microlens and the packaging substrate, the present invention facilitates the use of conventional packaging techniques (i.e., applying cement directly onto protective layer 150 or microlens 145, and attaching the packaging substrate directly to the cement), thereby reducing packaging costs.

Figure 4A:
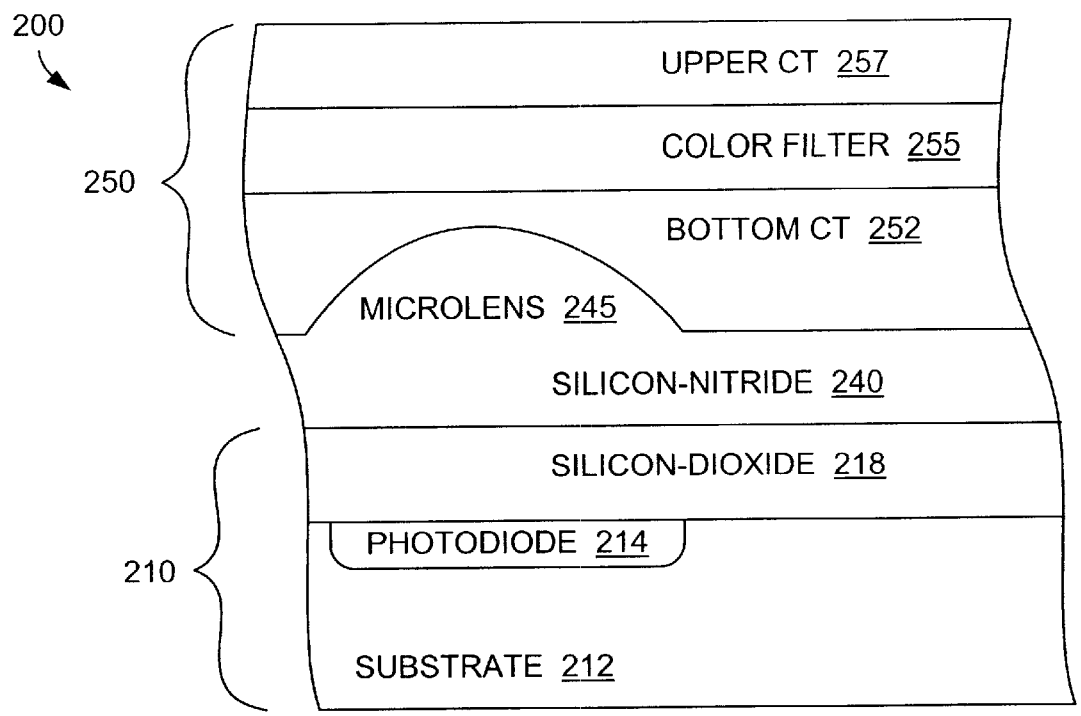
FIG. 4(A) is a schematic diagram of a color image sensor device according to a second embodiment of the present invention.

FIG. 4(A) is a cross-sectional view showing a portion of a color image sensor 200 in accordance with a second aspect of the present invention. Color image sensor 200 includes an image sensing element 210, a silicon-nitride layer 240 formed over image sensing element 210 that is etched to include a microlens 245, a lower (first) color transparent (CT) layer 252 formed on microlens 245, a color filter layer 255 formed on lower CT layer 252, and an upper CT layer 257 formed on color filter layer 255. Similar to image sensor device 100 (discussed above), image sensing element 210 includes a photodiode region 214 that is formed in substrate 212, and a passivation region including silicon-dioxide (SiO$_2$) layer 218 that is formed on substrate 212.

Lower CT layer 252, color filter layer 255 and upper CT layer 257 form a color filter structure (protective layer) 250 over microlens 245 that functions, in part, to protect microlens 245. In one embodiment, lower CT layer 252 is formed from a polymeric material (e.g., negative photoresist based on an acrylic polymer) having an index of refraction that is lower than that of silicon-nitride, thereby allowing microlens 245 to focus light beams passing through lower CT layer 252 onto photodiode region 214. Lower CT layer 252 provides both a planar surface and adhesion for color filter layer 255. Color filter layer 255 is formed from known materials (e.g., negative photoresist based on an acrylic polymer including color pigments) using known techniques. Finally, upper CT layer 257 is formed from a polymeric material—(e.g., negative photoresist based on an acrylic polymer), and serves both to seal and protect color filter layer 255.

Figure 4B:
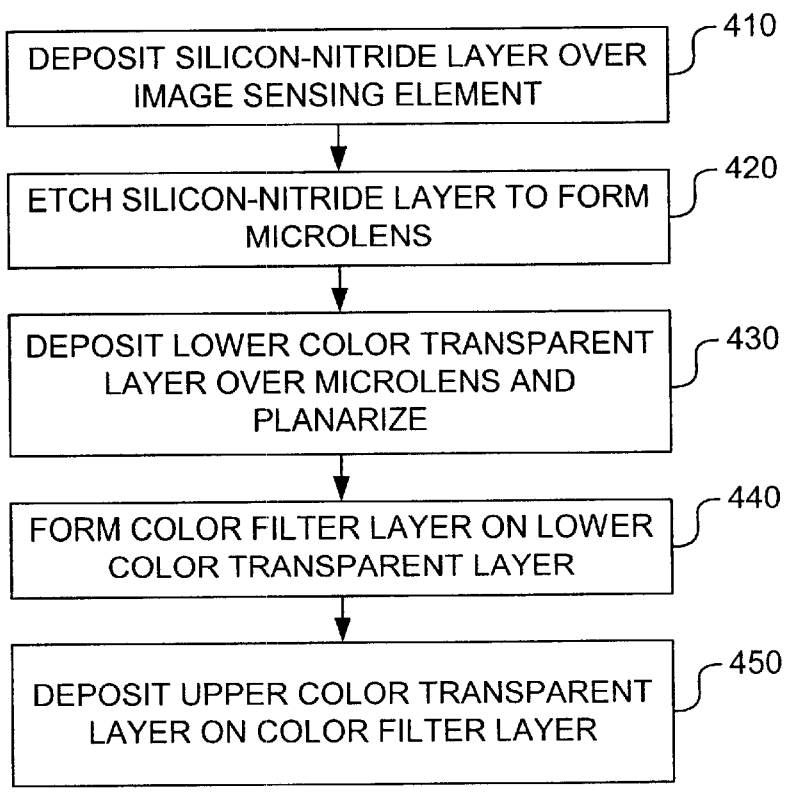
FIG. 4(B) is a flow diagram showing the basic steps for fabricating the color image sensor device shown in FIG. 4(A)

FIG. 4(B) is a flow diagram showing the basic steps associated with the formation of color image sensor 200 in accordance with the present invention. The process shown in FIG. 4(B) is performed after image sensing element 210 (FIG. 4(A)) is fabricated using known techniques.

Referring to FIG. 4(B), silicon-nitride layer 240 is deposited over silicon-dioxide layer 218 (Step 410), and silicon-nitride layer 240 is etched to form microlenses 245 (Step 420). Next, lower CT layer 252 is formed over microlens 245 and other residual portions of silicon-nitride layer 240, and is then planarized using known techniques (Step 430). Color filter layer 255 is then formed on lower CT layer 252 using known techniques (Step 440). Finally, upper CT layer 257 is formed on color filter layer 255. Although not shown in FIG. 4(B), a subsequent step of attaching a packaging substrate to upper CT layer 257 using conventional packaging techniques is made possible by embedding microlens 245 below color filter structure 250.

FIGS. 5(A) through 5(K) illustrate the method of producing color image sensor 200 in additional detail.

Figure 5A:
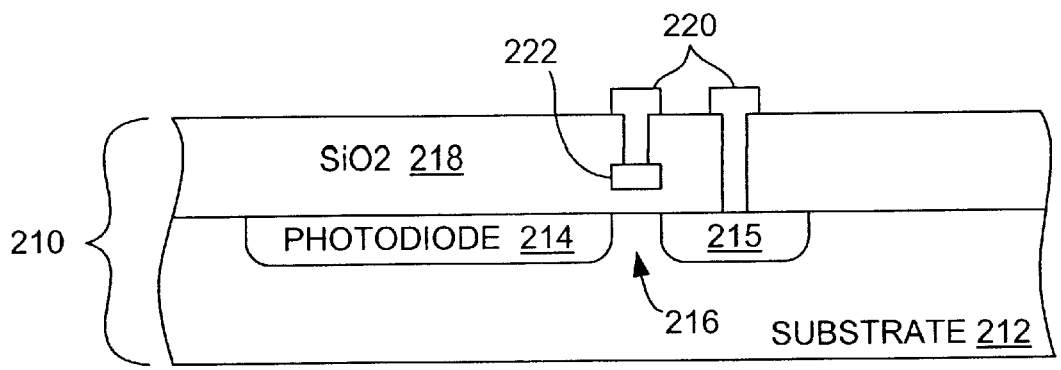
FIGS. 5(A) through 5(K) are cross-sectional views showing process steps associated with the production of a color imaging device in accordance with another embodiment of the present invention.

FIG. 5(A) is a cross-sectional view showing an initial structure that includes image sensing element 210. Image sensing element 210 includes photodiode region 214 and a charge transfer region 215 that are diffused into semiconductor (e.g., silicon) substrate 212, and base silicon-dioxide (SiO$_2$) layer 218 formed on substrate 212. Metal wires 220 are located in base SiO$_2$ layer 218 that connect to a polysilicon gate region 222 and to charge transfer region 215, thereby forming select transistor 116. These structures are fabricated using known techniques.

Figure 5B:
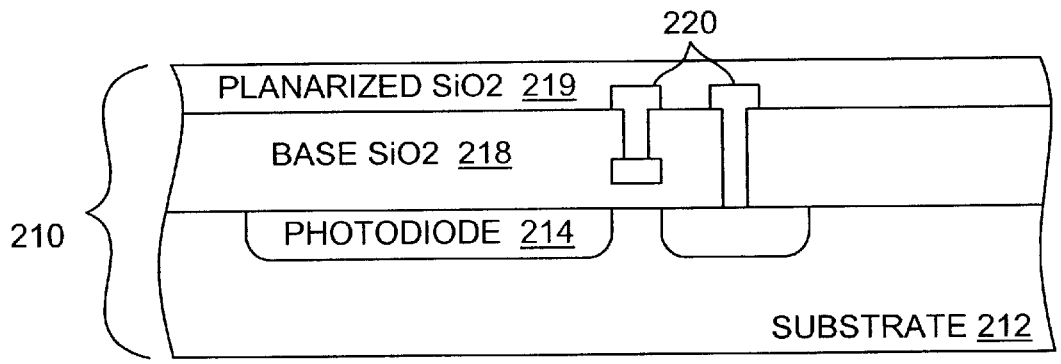

FIG. 5(B) illustrates an optional step of depositing a supplemental passivation (SiO$_2$) layer 19 on base SiO$_2$ layer 218, and planarizing supplemental SiO$_2$ layer 219 to provide a flat surface for the dielectric material used to form the embedded microlens. The planarized surface provided by supplemental SiO$_2$ layer 219 is not always required (in some cases, base SiO$_2$ layer 218 has a sufficiently planar surface). When used, the thickness of supplemental SiO$_2$ layer 219 is determined by the surface features of base SiO$_2$ layer 118 (e.g., by exposed wires 220), but made as thin as possible so that the subsequently-formed microlens structures are as close to photodiode region 214 as possible.

Figure 5C:
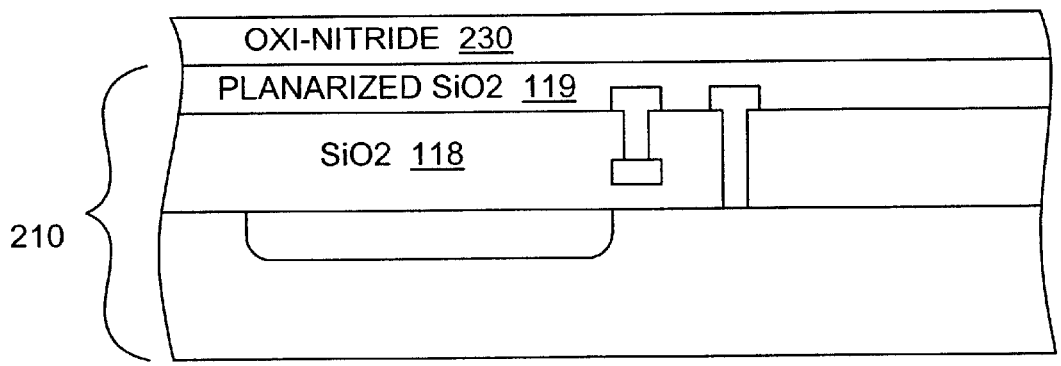

FIG. 5(C) illustrates another optional step of depositing an oxi-nitride layer 230 on planarized supplemental SiO$_2$ layer 219. Alternatively, oxi-nitride layer 230 may be formed directly on base SiO$_2$ layer 218 (i.e., when planarized supplemental SiO$_2$ layer 219 is not used). In one embodiment, oxi-nitride layer 230 has a thickness in the range of 2.5 of 3.5 microns, and functions as a stress relief layer.

Figure 5D:
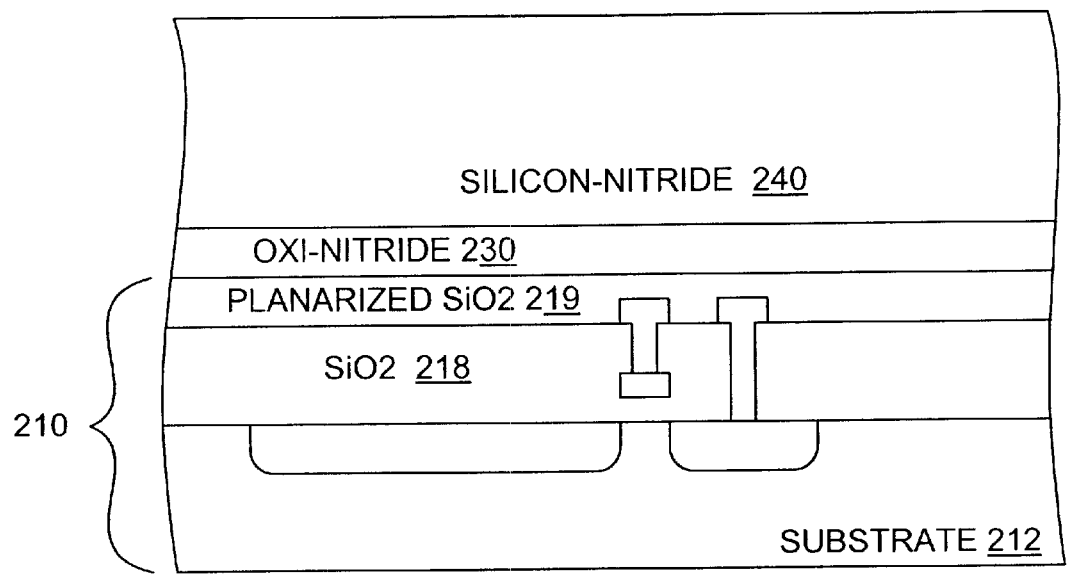

FIG. 5(D) illustrates a subsequent step of depositing silicon-nitride layer 240 over image sensing element 210. When both steps shown in FIGS. 5(B) and 5(C) are used, silicon-nitride layer 240 is formed on oxi-nitride layer 230. Note that silicon-nitride layer 240 may be formed on planarized supplemental SiO$_2$ layer 219 or base SiO$_2$ layer 218 if these steps are respectively omitted. In the present example, silicon-nitride layer 240 has a thickness in the range of 3 to 5 microns.

Figure 5E:
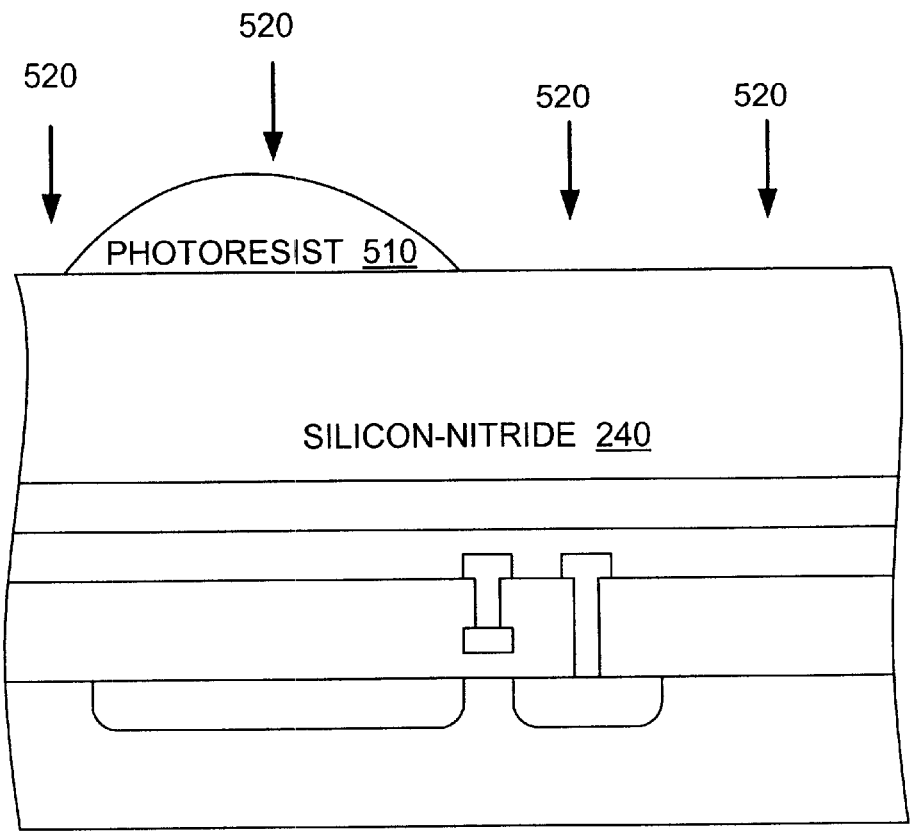

FIG. 5(E) is a cross-sectional view showing the formation of a photoresist portion 510 on silicon-nitride layer 240 and subsequent application of etchant 520. Photoresist portion 510 is formed by depositing a layer of photoresist on silicon-nitride layer 240, exposing the photoresist layer through a mask (either "halftone" or sharp geometry), developing the photoresist layer, and removing portions of the photoresist layer that were exposed. This process is performed using well-known techniques. When a sharp geometry mask is used, photoresist portion 510 is heated to create the required lens-shaped geometry using known techniques. This heating process is not needed when a "halftone" mask is used to form photoresist portion 510. The resulting photoresist portion 510 has a shape that essentially mirrors that of the desired microlens and is located directly over the portion of silicon-nitride layer 240 used to form the microlens. The actual shape of photoresist portion 510 depends upon the selectively of the photoresist material versus that of silicon-nitride layer 240. Etching is subsequently performed using an anisotropic reactive ion etching (RIE) process that "copies" the lens-like shape of photoresist portion 510 into silicon-nitride layer 240. That is, the thinner peripheral portions of photoresist portion 510 are removed before the thicker central portions, thereby causing more etching of silicon-nitride layer 240 under the periphery of photoresist portion 510 than under the central portion. Consequently, the lens-like shape of photoresist portion 510 is "copied" into silicon-nitride layer 240.

Figure 5F:
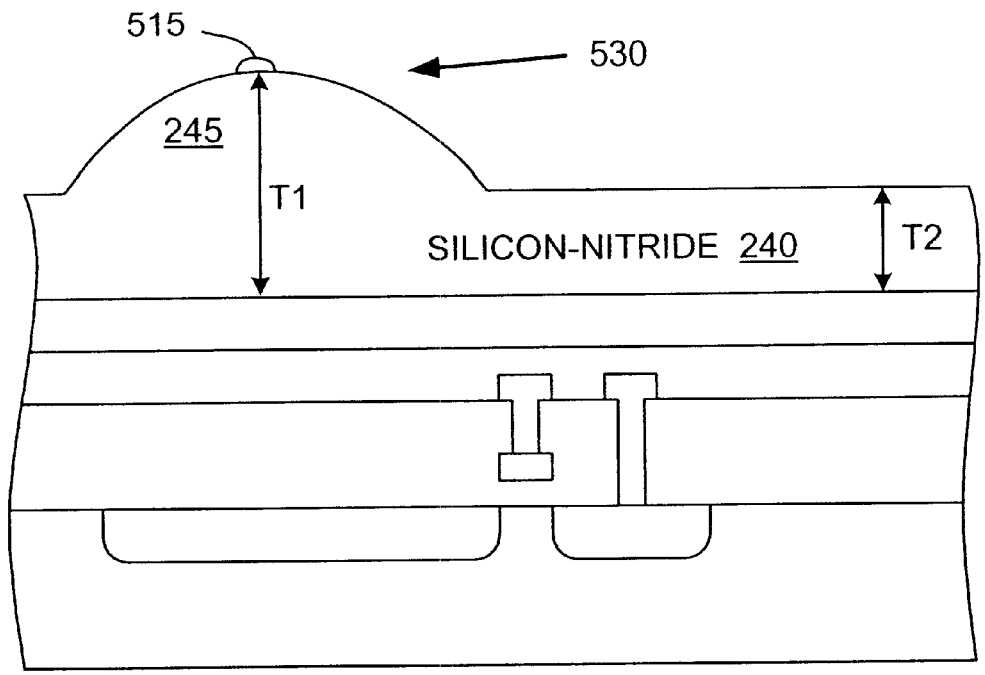

FIG. 5(F) is a cross-sectional view showing silicon-nitride layer 240 after the etching process. The resulting shape of microlens 240 is essentially the same as that of photoresist portion 510. In one embodiment, microlens 245 has a peak thickness T1 in the range of 3 to 5 microns. The remaining portions of silicon-nitride layer 240 located adjacent to microlens 245 have a thickness T2 in the range of 0.65 to 1 micron. Residual photoresist material 515 and other polymeric residues are then removed using a solvent 530.

Figure 5G:
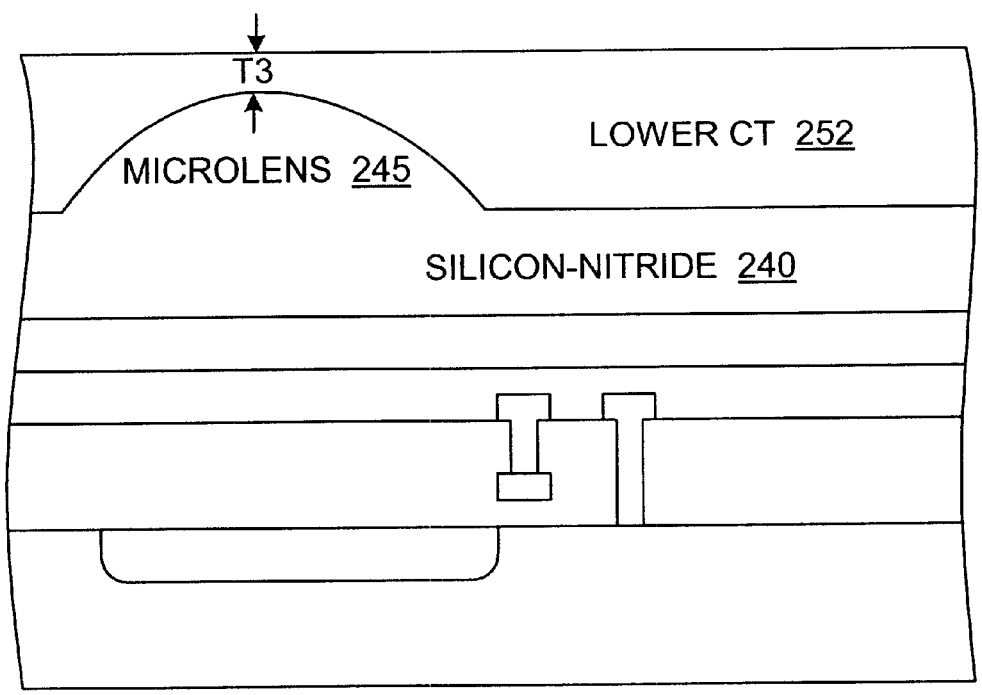

FIG. 5(G) is a cross-sectional view showing the subsequent deposition and planarization of lower CT layer 252 on microlens 245 and the remaining portions of silicon-nitride layer 240. After planarization, lower CT layer preferably has a thickness T3 in the range of 1.1 to 1.3 microns.

Figure 5H:
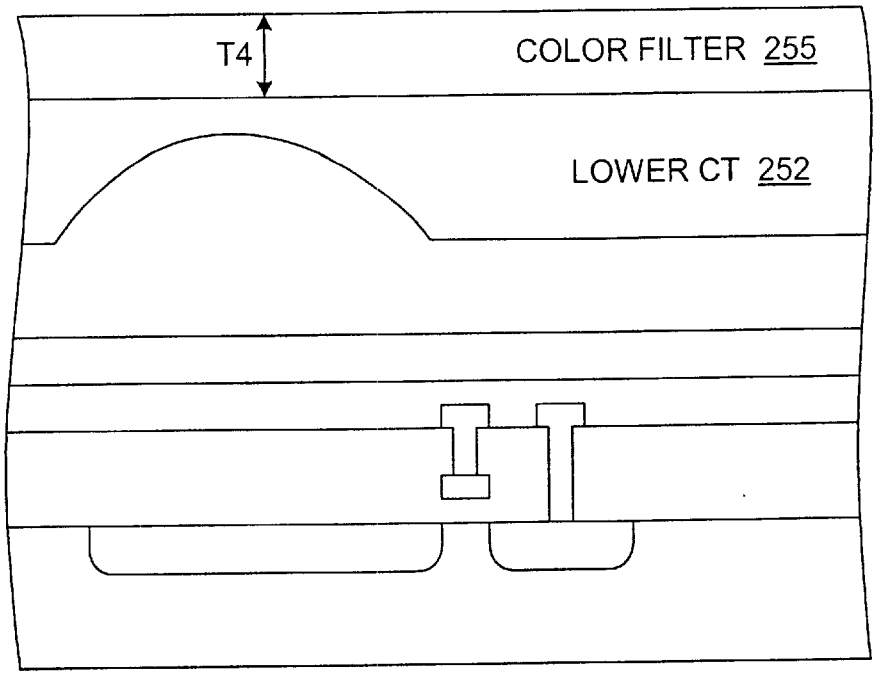

FIG. 5(H) is a cross-sectional view showing the subsequent formation of color filter layer 255 on lower CT layer 252. Color filter layer 255 is formed using known techniques and has a resulting thickness T4 in the range of 1.0 to 1.4 microns.

Figure 5I:
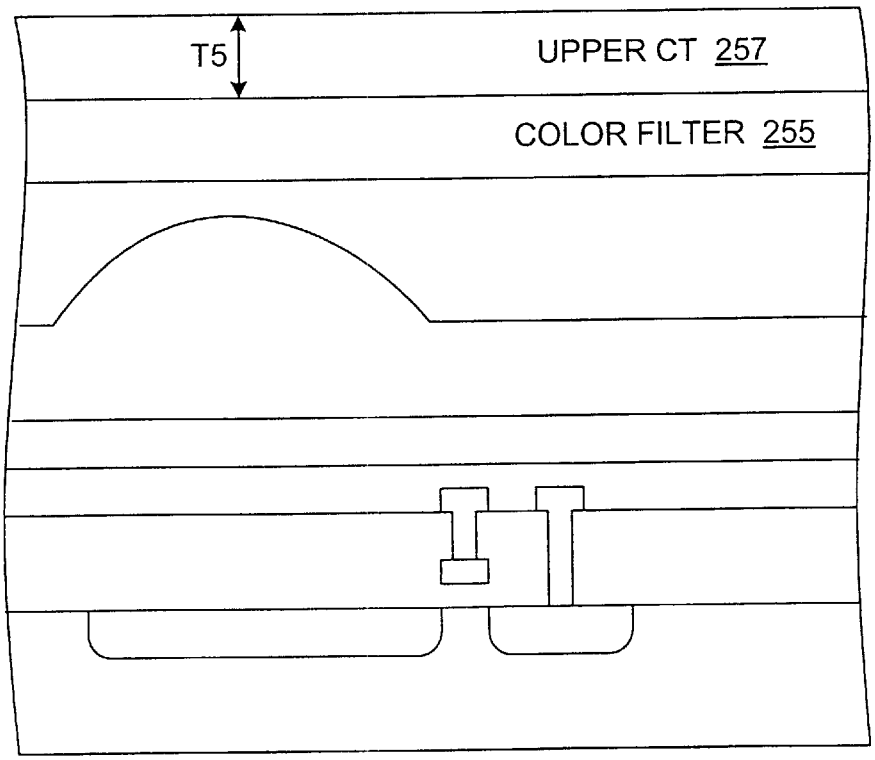

FIG. 5(I) is a cross-sectional view showing the subsequent formation of upper CT layer 257 on color filter layer 255. Upper CT layer 257 is formed from polymeric material or resin, and has a resulting thickness T5 in the range of 0.8 to 1.1 microns.

Figure 1A:
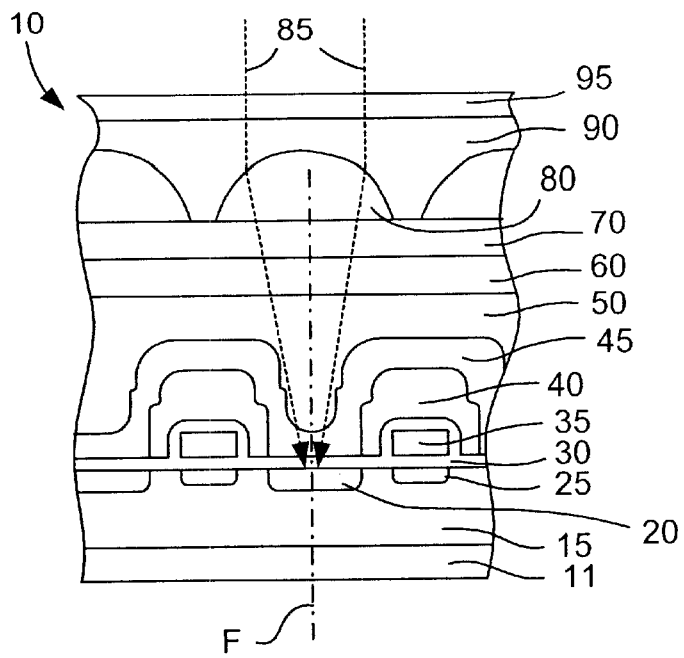
FIGS. 1(A) and 1(B) are cross-sectional side views showing a conventional solid-state imaging device in which normal and oblique light beams are focused by a microlens.
Figure 1B:
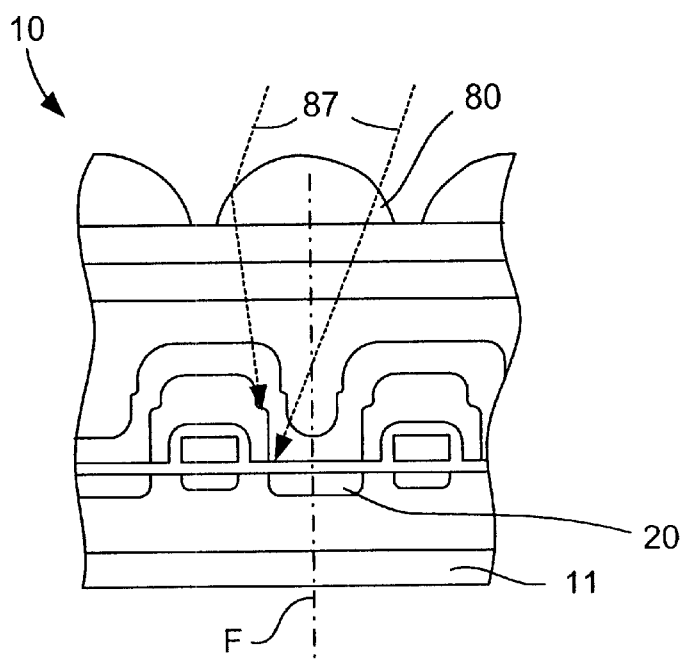
Figure 5J:
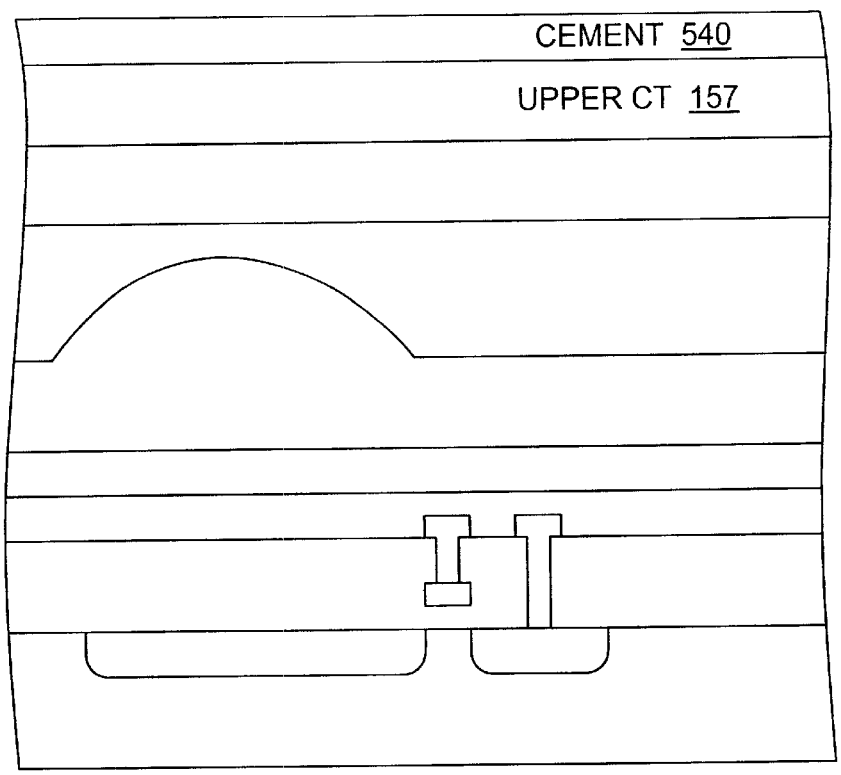
Figure 5K:
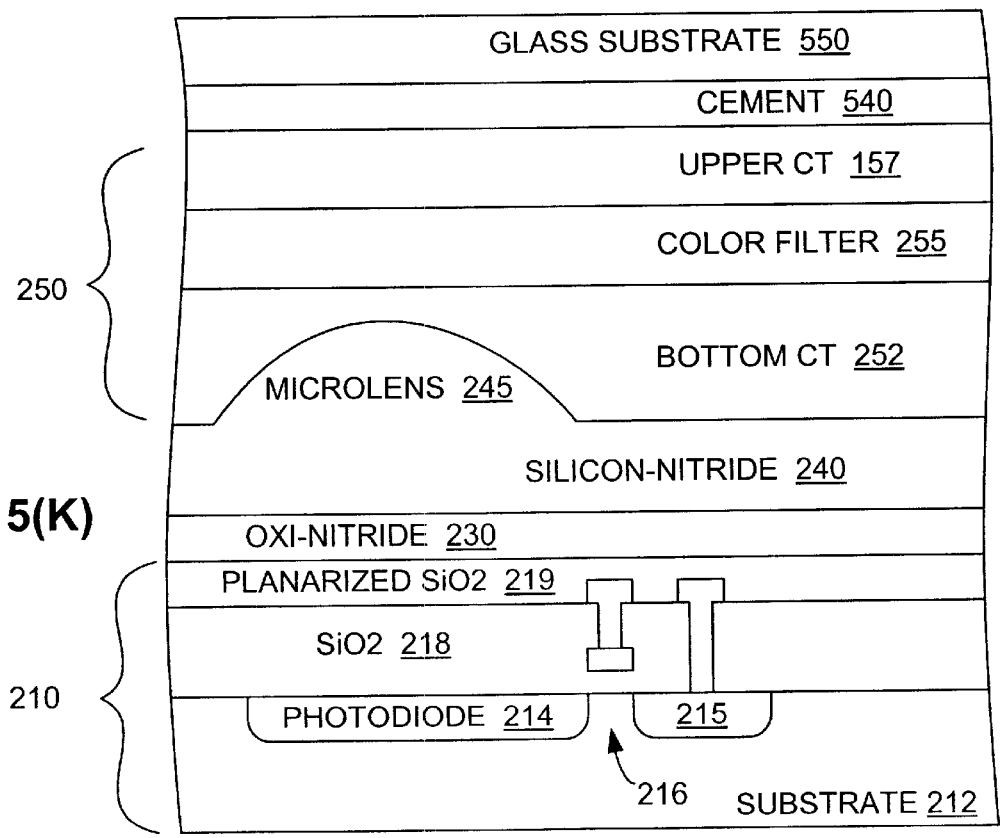

A benefit provided by the fabrication process illustrated in FIGS. 5(A) through 5(I) is that standard packaging techniques can be used, thereby reducing overall production costs. A simplified representation of these standard packaging techniques is depicted in FIGS. 5(J) and 5(K). As shown in FIG. 5(J), a transparent cement 540 (e.g., novolac epoxy resin) is applied to an upper surface of upper color transparent layer 257. Next, as shown in FIG. 5(K), a packaging substrate 550 (e.g., glass) is mounted onto cement 540, thereby attaching packaging substrate 550 to color transparent layer 257. Note that, unlike the prior art structure shown in FIG. 1(A), microlens 245 is embedded between color filter structure 250 and image sensing element 210. Therefore, the present invention facilitates the use of standard packaging (i.e., attaching packaging substrate 550 using cement), thereby providing such color CMOS image sensor devices at lower cost than conventional devices.

Although the invention has been described in connection with several embodiments, it is understood that this invention is not limited to the embodiments disclosed, but is capable of various modifications which would be apparent to a person skilled in the art. For example, the particular parameters set forth in the above example are exemplary, and may be altered to meet the requirements of particular fabrication processes. Thus, the invention is limited only by the following claims.

What is claimed is:

1. An image sensor comprising:
    an image sensing element formed in a semiconductor substrate;
    a microlens located over the image sensing element, the microlens being formed from a dielectric material having a first index of refraction; and
    a layer of packaging adhesive formed directly on the microlens, the packaging adhesive having a second index of refraction,
    wherein a first index of refraction of the dielectric material is different from the second index of refraction of the packaging adhesive.

2. The image sensor according to claim 1, wherein the dielectric material is silicon-nitride.

3. The image sensor according to claim 1, further comprising a packaging substrate mounted on the cement layer.

4. An image sensor comprising:
    an image sensing element formed in a semiconductor substrate;
    a microlens located over the image sensing element, the microlens being formed from a dielectric material having a first index of refraction; and
    a protective layer formed on the microlens, the protective layer having a second index of refraction,
    wherein a first index of refraction of the dielectric material is different from the second index of refraction of the protective layer, and
    wherein the protective layer comprises:
        a lower color transparent layer formed on the microlens;
        a color filter layer formed on the lower color transparent layer; and
        an upper color transparent layer formed on the color filter layer.

5. The image sensor according to claim 4, wherein the dielectric material is silicon-nitride.

6. The image sensor according to claim 4, wherein the lower color transparent layer comprises an acrylic polymer.

7. The image sensor according to claim 4, further comprising a packaging substrate attached to an upper surface of the upper color transparent layer.

8. An image sensor comprising:
    an image sensing element formed in a semiconductor substrate;
    a passivation layer formed over the image sensing element;
    an oxi-nitride layer formed on an upper surface of the passivation layer;
    a microlens located over the image sensing element, the microlens comprising silicon-nitride and having a first index of refraction; and
    a protective layer formed on the microlens, the protective layer having a second index of refraction,
    wherein a first index of refraction of the microlens is different from the second index of refraction of the protective layer.

9. An image sensor comprising:
    an image sensing element formed in a semiconductor substrate;
    a microlens located over the image sensing element, the microlens comprising silicon-nitride;

a first color transparent layer formed on the microlens; and a color filter layer formed on the first color transparent layer.

10. The image sensor according to claim 9, further comprising a second color transparent layer formed on the color filter layer.

11. The image sensor according to claim 10, further comprising:

a cement layer formed on the second color transparent layer; and a packaging substrate mounted on the cement layer.

* * * * *